United States Patent [19]

Beavis et al.

[11] Patent Number: 5,121,871

[45] Date of Patent: Jun. 16, 1992

[54] SOLDER EXTRUSION PRESSURE BONDING PROCESS AND BONDED PRODUCTS PRODUCED THEREBY

[75] Inventors: Leonard C. Beavis; Maurice M. Karnowsky, both of Albuquerque; Frederick G. Yost, Ceder Crest, all of N. Mex.

[73] Assignee: The United States of America as represented by the United States Department of Energy, Washington, D.C.

[21] Appl. No.: 511,684

[22] Filed: Apr. 20, 1990

[51] Int. Cl.$^5$ .............. H01L 21/50; B23K 1/19
[52] U.S. Cl. ................... 228/123; 228/124; 228/198
[58] Field of Search ............... 228/122-124, 228/198, 256, 263.18, 233; 357/81; 437/221, 222

[56] References Cited

U.S. PATENT DOCUMENTS

| | | | |
|---|---|---|---|
| 3,314,771 | 4/1967 | Hoffman et al. | 228/263.18 |
| 3,651,562 | 3/1972 | Hambleton | 29/473.1 |
| 3,839,727 | 10/1974 | Herdzik et al. | 357/71 |
| 3,923,609 | 12/1975 | Welch et al. | 204/16 |
| 4,316,573 | 2/1982 | DeCristafaro et al. | 228/263.18 |
| 4,418,857 | 12/1983 | Ainslie et al. | 228/198 |
| 4,444,352 | 4/1984 | Glascock, II et al. | 228/193 |
| 4,518,112 | 5/1985 | Miller et al. | 228/198 |
| 4,709,849 | 12/1987 | Socolowski | 228/56.3 |
| 4,824,009 | 4/1989 | Master et al. | 228/124 |
| 4,922,322 | 5/1990 | Mathew | 228/123 |
| 4,927,069 | 5/1990 | Ushikubo et al. | 228/123 |

FOREIGN PATENT DOCUMENTS 147490 11/1980 Japan .................. 228/125

OTHER PUBLICATIONS

Metals Handbook Ninth Edition, vol. 6, "Solder Joint Metallurgy", pp. 1095–1098, copyright 1983.
D. Kinser et al., "Reliability of Soldered Joints in Thermal Cycling Environments", *Electronic Packaging and Production, NEPCON*, '76 East Show Edition, May 1976, pp. 61–68.
D. Jarboe, "Thermal Fatigue Evaluation of Solder Alloys", Report BDX-613-2341, Feb. 1980, pp. 1–31.
R. Wild, "Some Fatigue Properties of Solders and Solder Joints", INTERNEPCON, IBM Federal Systems Division, Brighton, England, IBM Publication, No. 74Z000481, Oct. 1975, pp. 1–28.

*Primary Examiner*—Samuel M. Heinrich
*Attorney, Agent, or Firm*—Anne D. Daniel; James H. Chafin; William R. Moser

[57] ABSTRACT

Production of soldered joints which are highly reliable and capable of surviving 10,000 thermal cycles between about −40° C. and 110° C. Process involves interposing a thin layer of a metal solder composition between the metal surfaces of members to be bonded and applying heat and up to about 1000 psi compression pressure to the superposed members, in the presence of a reducing atmosphere, to extrude the major amount of the solder composition, contaminants including fluxing gases and air, from between the members being bonded, to form a very thin, strong intermetallic bonding layer having a thermal expansion tolerant with that of the bonded members.

10 Claims, No Drawings

SOLDER EXTRUSION PRESSURE BONDING PROCESS AND BONDED PRODUCTS PRODUCED THEREBY

The U.S. Government has rights to this invention pursuant to Contract No. DE-AC04-76DP00789 awarded by the U.S. Department of Energy to AT&T Technologies, Inc.

BACKGROUND OF THE INVENTION

1. Field of the Invention

This invention relates to a novel process for producing very thin, strong solder bonds or joints between the metallic surfaces of members, such as between a copper heat sink member and a metal-coated silicon cell or chip, and to novel bonded members produced by such process in which the solder bond is capable of undergoing 10,000 cycles of thermal testing between −40° C. and 110° C. with a very low incidence of failure.

DISCUSSION OF THE PRIOR ART

Temperature stable solder connections, capable of undergoing thousands of cycles at temperatures between −40° C. and 110° C., are highly desirable for many applications where temperature variations are encountered during use, such as in space aeronautics electrical applications, and/or also in cases where the soldered members are present within sealed housings and/or otherwise are inaccessible for repair.

The major cause of interconnection failure during thermal cycle testing is the development of cracks in the interconnection solder, resulting in separation of the bonded members or substantial reduction in electrical conductivity between the members through the interconnection.

Reference is made to the following publications which relate to the problem of lack of reliability of solder interconnections as determined by thermal cycle testing: the Kinser et al. article titled "Reliability of Soldered Joints in Thermal Cycling Environments", published on pages 62–68 of NEPCON '76 East Show Edition, May 1976; the Jarboe report titled "Thermal Fatigue Evaluation of Solder Joints", pages 1–31, Report BDX-613-2314, published in February 1980 by Bendix Corporation, Kansas City Division, and the Wild article titled "Some Fatigue Properties of Solders and Solder Joints", Internepcon, Brighton, England, pages 1–28, published in October, 1975 as IBM Publication No. 74Z000481 by IBM Federal Systems Division, Oswego, N.Y.

The aforementioned publications discuss interconnection problems, thermal cycle testing, failure rates, possible causes of failure and various solder compositions and bonding methods used in attempts to solve the problems.

Reference is also made to the following U.S. patents for their disclosure of thermal compression bonding methods and materials and/or the formation of intermetallic bonding layers:

U.S. Pat. No. 3,839,727 to Herdzik et al. discloses the use of soft malleable lead-tin solder compositions for forming bonding layers by dispersing intermetallics within the solder solution at solder reflow temperatures of 350° C. to form ternary intermetallic regions in the solder bonding layer.

U.S. Pat. No. 3,923,609 to Welch discloses intermetallic bonding methods using conductive epoxy bonding materials, solders, adhesives, welding electrodes, etc.

U.S. Pat. No. 3,651,562 to Hambleton discloses thermocompression bonding methods employing low temperatures in the area of 150° C. and extremely high pressures of 50,000 psi.

U.S. Pat. No. 4,444,352 to Glascock et al. discloses thermocompression bonding processes for bonding semiconductor devices having first and second metal surfaces directly to each other in the absence of interposed solder at temperatures between 300°–400° C. and at high pressures between about 1500 and 5000 psi. The metal surfaces are pre-treated to remove oxidation and pre-annealed, and are exposed to an inert atmosphere prior to thermocompression. A desired maximum pressure of between 5000 and 12,000 psi is disclosed.

The methods and materials disclosed by the aforementioned patents fail to produce bonds capable of undergoing several thousand thermal cycles at −40° to 110° C. without a high percentage of failure.

SUMMARY OF THE INVENTION

The present invention relates to a novel thermocompression soldering process for producing extremely thin, non-contaminated hard intermetallic bonding layers uniting metallic members, including metal-coated semiconductor bodies, which bonding layers have substantially greater strength than conventional solder layers and have substantially reduced thermal creep. The reduced creep assures that normal stresses due to thermal expansion mismatch between the metals of the members being united and the metals of the intermetallic bonding layer are minimized and are within the normal elastic range encountered at temperatures between about −40° C. and 110° C. Thermal expansion mismatch in conventional bonding systems results in distortion, cracking and failure of a high percentage of such bonds after relatively few thermal cycles of testing at temperatures ranging between −40° C. and 110° C.

Another cause of such failures is the presence or entrapment of air or other gases or impurities within the solder joint or intermetallic bonding layer, which materials can react and/or expand during thermal cycle testing or use and degenerate, crack or disrupt the bond.

The novel process of this invention comprises interposing a thin layer of metal solder between metallic surfaces of members to be bonded, and heating to a temperature at or above the remelt temperature of the solder, i.e., 150° C. to 400° C. while compressing the members and interposed solder layer under a pressure up to about 1000 psi, preferably between about 40 and 100 psi, most preferably 60±5 psi, in the presence of a reducing gas atmosphere, such as a mixture of hydrogen and nitrogen. Such process causes the solder layer to be melted and extruded to a major extent from between the members being bonded, leaving behind a hard bonding layer which is very thin, substantially free of the solder and comprises an intermetallic layer formed between at least one metal of the solder and one or more metals from the metallic surfaces of the bonded members.

The presence of a reducing atmosphere during bonding prevents and/or chemically reduces metal oxide contaminants which might interfere with the formation of the intermetallic bonding layer and/or its integrity, strength and resistance to degradation during thermal cycling or use.

The application of compression or lamination pressures up to about 1000 psi, preferably between about 40 and 100 psi, particularly in cases where one of the members being bonded is a brittle metallized member such as a ceramic, silicon cell or chip, serves two important functions at the melting temperature of the solder composition and in the presence of a reducing atmosphere. The compression step causes the molten solder to completely wet the metallic surfaces of the members being bonded, displacing air and other gases or contaminants from any surface irregularities of such metallic surfaces. The compression step also causes the extrusion or displacement of the major amount of the solder from between the metallic surfaces, carrying with it contaminants such as flux gas and air, and leaving behind a very thin intermetallic bonding layer which fills any irregularities which exist between the contacting metallic surfaces. The intermetallic bonding layer is formed by reaction between one or more metals of the solder composition, e.g., tin, and one or more metals of the surfaces being bonded, e.g., copper, silver, aluminum, titanium, iron, nickel, gold, etc., to produce a hard metal joint which is free or nearly free of solder and is much stronger and more thermally creep-resistant than thicker bonding layers and/or solder-containing bonding layers.

The present process is particularly useful for the bonding of electrical components, such as metallized ceramics or silicon cells, and metallic heat sink members such as copper, nickel, iron or other heat-conductive metal plates, foils or coatings, and for forming strong electro-conductive bonds between leads and pad members.

The preferred solder compositions for use according to the present process are thin foils of tin-lead composition having a thickness between about 0.01" and 0.0005", more preferably between about 0.001" and 0.005" although thin layers of such compositions may be pre-applied to either of the metallic surfaces bonded. The present solders preferably contain at least about 30% by weight of lead, which is soft and inert with respect to the formation of intermetallic combinations with the metals being bonded. The other metal of the present solders preferably is tin but other metals can also be used, such as indium, silver, antimony, bismuth, aluminum, zinc, platinum, etc., alone, or in combination with tin or with each other. In all cases it is preferred that the melting temperature of the solder composition is below about 400° C. During use in the present process, the final thickness of the intermetallic bonding layer formed by the thermocompression of the solder composition is about 0.0002", as measured by metallographic means, in the case of relatively co-planar metallic surfaces bonded thereby. Obviously rougher metallic surfaces will accommodate thicker intermetallic bonding layers therebetween.

Metallic surfaces being bonded according to the present invention may comprise wires, plates, foils or coatings, including vapor-deposited coatings, of copper, nickel, silver, palladium, platinum or chromium.

The following example is given by way of illustration and should not be considered limitative.

EXAMPLE

A plurality of silicon cells is metallized on one smooth surface of each with a vacuum-deposited layer of palladium, titanium and silver, and are further electroplated with silver. A 0.002" thick foil of tin-lead solder (62% tin, 38% lead) is interposed between the metallized surface of a plurality of the silicon cells and the smooth surface of a plurality of copper sink layers, the combinations being present between the pressure plates of a laminating press enclosed within a reducing gas atmosphere of 90 parts nitrogen gas and 10 parts hydrogen gas. The pressure plates are heated to 350° C. and a pressure of 60 psi is exerted on the stack to melt each solder foil and compress the members, causing the major amount of the solder to be extruded from between the metallic surfaces being bonded, washing or carrying with it any air, gases or other contaminants present. The extruded solder contains substantially all of the solder present in the original solder foil which had not reacted with the copper sink layer.

After cooling, the pressure is relaxed by separating the pressure plates and the individual bonded units are examined. The thickness of the bonding layer of each unit is found to be about 0.0002", one-tenth the thickness of the original foils, as measured by metallographic means.

The formed units are subjected to thermal cycling of −40° C. to 110° C. and are found to survive 10,000 cycles with only slight deterioration, as determined by ultrasonic transmission testing. Before thermal cycling, the units exhibited greater than ultrasonic transmission on the average through the bonding layer, and after 10,000 thermal cycles the units still exhibited 75% ultrasonic transmission on the average through the bonding layer, illustrating the strength and integrity of the bonding layer even after such rigorous testing.

An examination of the bonding layers revealed the presence of an intermetallic silver-copper-tin layer which is substantially free of lead and substantially harder and stronger than solder-containing layers.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

What is claimed is:

1. A process for producing a strong, creep-resistant, thin intermetallic bonding layer, said process comprising:
   forming a stack by superposing at least two members having relatively smooth flat metallic surfaces to be bonded;
   interposing between said surfaces a relatively thin layer of a soft solder composition containing at least one metal which is capable of forming an intermetallic compound by reaction with one or more of the metals of the surfaces being bonded;
   heating said stack to melt said solder layer in the presence of a reducing gas atmosphere;
   simultaneously compressing said stack under sufficient pressure to completely wet said surfaces and to extrude the major volume of solder from between said metallic surfaces along with contaminants; and
   cooling said stack to produce bonded members united by a strong, creep-resistant thin intermetallic bonding layer.

2. Process according to claim 1 in which one of said at least two members comprises a ceramic body having a metal-coated surface.

3. Process according to claim 2 in which said member is a vacuum metallized silicon body.

4. A process according to claim 3 in which the metal coating of said vacuum metallized silicon body member is comprised of silver.

5. Process according to claim 2 in which the other of said at least two members comprises a copper heat sink layer.

6. A process according to claim 1 in which said at least one of said metals of said soft solder composition comprises tin.

7. Process according to claim 1 which comprises heating said stack to a temperature between about 300° C. and 400° C.

8. Process according to claim 1, in which said pressure is between about 40 psi and about 100 psi.

9. Process according to claim 8 in which said pressure is 60±5 psi.

10. The process of claim 1 wherein said stack is compressed at up to 1000 psi.

* * * * *